(12) United States Patent
Lin et al.

(10) Patent No.: US 12,125,551 B2
(45) Date of Patent: *Oct. 22, 2024

(54) STRUCTURE FOR MULTIPLE SENSE AMPLIFIERS OF MEMORY DEVICE

(71) Applicant: TAIWAN SEMICONDUCTOR MANUFACTURING CO., LTD., Hsinchu (TW)

(72) Inventors: Ku-Feng Lin, New Taipei (TW); Hiroki Noguchi, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/874,973

(22) Filed: Jul. 27, 2022

(65) Prior Publication Data

US 2022/0358973 A1 Nov. 10, 2022

Related U.S. Application Data

(63) Continuation of application No. 16/943,345, filed on Jul. 30, 2020, now Pat. No. 11,450,357.

(Continued)

(51) Int. Cl.
*G11C 16/04* (2006.01)
*G11C 7/06* (2006.01)
(Continued)

(52) U.S. Cl.
CPC .............. *G11C 7/062* (2013.01); *G11C 11/16* (2013.01); *G11C 13/004* (2013.01)

(58) Field of Classification Search
CPC ....... G11C 7/062; G11C 11/16; G11C 13/004; G11C 11/1673; G11C 2013/0054; G11C 7/06
(Continued)

(56) References Cited

U.S. PATENT DOCUMENTS 6,269,040 B1 7/2001 Reohr et al.
7,272,062 B2 9/2007 Taddeo
(Continued)

FOREIGN PATENT DOCUMENTS

CN 106486153 A 3/2017
CN 108122567 A 6/2018
(Continued)

*Primary Examiner* — Tha-O H Bui
(74) *Attorney, Agent, or Firm* — Birch, Stewart, Kolasch & Birch, LLP

(57) ABSTRACT

A memory device includes a plurality of sense amplifiers, a plurality of memory cells, a plurality of data lines, a plurality of reference cells, and a connection line. The memory cells are coupled to a plurality of first inputs of the plurality of sense amplifiers respectively. The data lines are coupled to a plurality of second inputs of the plurality of sense amplifiers respectively. The reference cells are arranged in a plurality of columns respectively and coupled to the plurality of data line respectively. Each of the plurality of reference cells includes a plurality of resistive elements. The connection line is coupled to the plurality of data lines. In a read mode, one of the sense amplifiers is configured to access the plurality of resistive elements arranged in at least one of the plurality of columns.

20 Claims, 11 Drawing Sheets

Related U.S. Application Data

(60) Provisional application No. 62/928,030, filed on Oct. 30, 2019.

(51) Int. Cl.
*G11C 11/16* (2006.01)
*G11C 13/00* (2006.01)

(58) Field of Classification Search
USPC ........................................................ 365/185.2
See application file for complete search history.

(56) References Cited

U.S. PATENT DOCUMENTS

| | | | |
|---|---|---|---|
| 7,613,868 B2 * | 11/2009 | Yang | G11C 8/14 |
| | | | 365/171 |
| 8,625,337 B2 * | 1/2014 | Wu | G11C 11/1659 |
| | | | 365/158 |
| 8,687,412 B2 | 4/2014 | Chih et al. | |
| 8,917,536 B2 | 12/2014 | Jan et al. | |
| 9,165,629 B2 * | 10/2015 | Chih | G11C 29/021 |
| 9,166,629 B1 | 10/2015 | Chih et al. | |
| 10,255,959 B2 * | 4/2019 | Lee | G11C 29/52 |
| 10,726,896 B1 | 7/2020 | Jacob et al. | |
| 2009/0201717 A1 * | 8/2009 | Maeda | G11C 11/16 |
| | | | 365/158 |
| 2014/0003137 A1 * | 1/2014 | Noshiro | G11C 11/161 |
| | | | 365/158 |
| 2014/0063931 A1 | 3/2014 | Willey | |
| 2014/0185361 A1 | 7/2014 | Oh et al. | |
| 2014/0269030 A1 | 9/2014 | Chih et al. | |
| 2017/0271002 A1 | 9/2017 | Sakhare | |
| 2018/0366186 A1 | 12/2018 | Han | |

FOREIGN PATENT DOCUMENTS

| | | |
|---|---|---|
| KR | 10-2014-0097954 A | 8/2014 |
| KR | 10-2014-0111912 A | 9/2014 |
| KR | 10-2016-0090759 A | 8/2016 |
| KR | 10-2016-0145591 A | 12/2016 |

* cited by examiner

STRUCTURE FOR MULTIPLE SENSE AMPLIFIERS OF MEMORY DEVICE

CROSS-REFERENCE TO RELATED APPLICATION

The present application is a continuation of U.S. application Ser. No. 16/943,345, filed Jul. 30, 2020, which claims priority to U.S. Provisional Patent Application No. 62/928,030, filed on Oct. 30, 2019, which is incorporated by reference herein in its entirety.

BACKGROUND

Resistive based memory devices (ReRAMs), such as magnetic random access memory (MRAM), phase changeable random access memory (PRAM), resistance random access memory (RRAM), etc. can store data by programming the resistance of cells included therein. In a conventional read operation of the magnetic random access memory, a method of passing a current from a sense amplifier to a magnetoresistive element, converting a current difference caused by the resistance of the magnetoresistive element into a difference of the voltage drop of a transistor in the sense amplifier, and amplifying the difference or the like is adopted. However, variations of resistances of elements induce huge fluctuation in the current, and it leads to large read error rate essentially.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
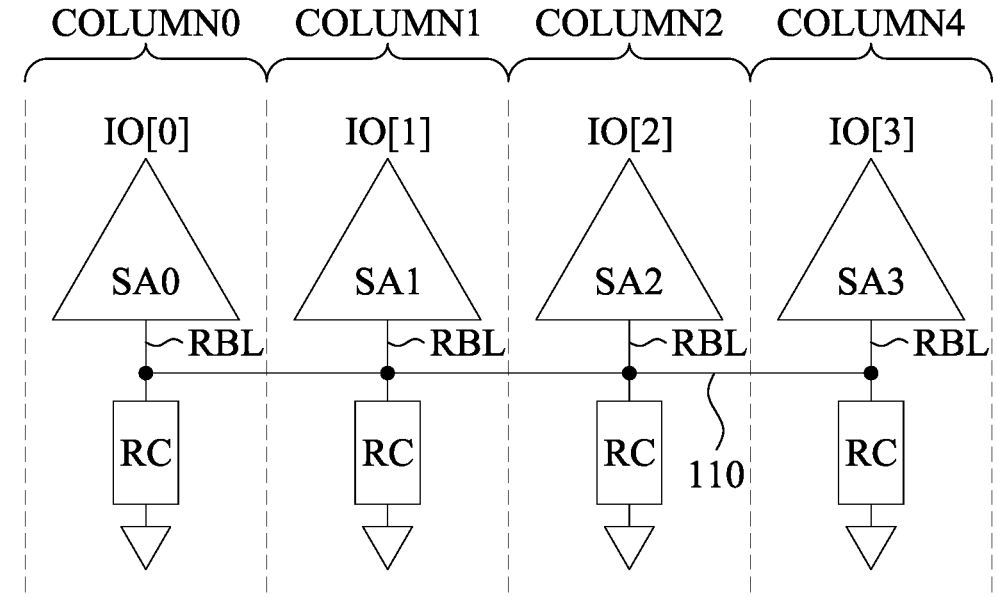
FIG. 1 is a schematic diagram of a memory device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a schematic diagram of a memory device 100 in accordance with various embodiments of the present disclosure. For illustration, the memory device 100 includes multiple reference cells RC and multiple sense amplifiers SA0-SA3. In some embodiments, the sense amplifiers SA0-SA3 are included in a data input/output circuit (not shown) and configured to compare reference signals with data cell signals corresponding to memory cells (i.e., memory cells MC in FIGS. 11-14), in order to determine logic states of bit data stored in the memory cells and output results through input/output data lines, for example, IO[0]-IO[3]. For example, in some embodiments, the reference signals are configured to provide reference currents, and the data cell signals are configured to provide data cell currents. Each of the sense amplifiers SA0-SA3 is configured to receive one of the reference currents and one of the data cell signals at its two terminals respectively. When a data cell current of one memory cell is determined by one of the sense amplifiers SA0-SA3 to be smaller than a corresponding reference current, a bit data in the memory cell is determined to have a logic high state. In contrast, when a data cell current of one memory cell is determined by one of the sense amplifiers SA0-SA3 to be greater than a corresponding reference current, a bit data in the memory cell is determined to have a logic low state.

As shown in FIG. 1, the sense amplifiers SA0-SA3 and the reference cells RC are arranged in columns COLUMN0-COLUMN3. The sense amplifiers SA0-SA3 are coupled to the reference cells RC through reference data lines RBL. In some embodiments, the reference data lines RBL are referred to as reference bit lines for transmitting reference currents/voltages to the sense amplifiers. Specifically, each of the sense amplifiers SA0-SA3 is coupled to one of the reference cells RC in one of the columns COLUMN0-COLUMN3. For example, the sense amplifier SA0 is coupled to the reference cell RC in the column COLUMN0, and the reference cell RC is further coupled to a ground. The configurations of the sense amplifiers SA1-SA3 are similar to that of the sense amplifier SA0. Thus, the repetitious descriptions are omitted here.

For illustration, the memory device 100 further includes a connection line 110. The connection line 110 is coupled to each of the reference data lines RBL, and the sense amplifiers SA0-SA3 are coupled together in parallel. Alternatively stated, the reference cells RC are coupled to each other in parallel, and each of the sense amplifiers SA0-SA3 is coupled to all of the reference cells RC.

In some embodiments, each one of the sense amplifiers SA0-SA3 includes a terminal coupled to the corresponding reference cell RC and the other terminal coupled to a one of memory cells. The memory cells are configured to store data having a high logic state (i.e., logic 1) or a low logic state (i.e., logic 0). Based on what is discussed above that the reference cells RC are coupled together, in some embodiments, the reference cells RC are configured to have an effective reference resistance between a high state resistance corresponding to the high logic state and a low state resistance corresponding to the low logic state of the memory cells. In various embodiments, the effective reference resistance is substantially a median value of the high state resistance and the low state resistance of the memory cells.

In some approaches, a memory device includes multiple sense amplifiers, and each of the sense amplifiers is coupled separately to several reference cells, for example, 4 cells, connected in series or in parallel for generating reference currents. However, the resistances of the reference cells vary due to the variation of manufacturing processes, wear degrees and other reasons. In some cases, the retention time of the reference cells is around 1 second, which means that the resistance and a logic state of the reference cells change after 1 second. Accordingly, a refresh operation is performed to the reference cells every second. However, some of the reference cells are not able to be refreshed and eventually the resistance and the logic state change. In that situation, those reference cells cause significant high variations of resistances among all reference cells and the variations result in deviation of reference currents. Therefore, when the sense amplifiers compare the data cell currents with the incorrect reference currents, erroneous data are often read. Alternatively stated, with the arrangement of some approaches, a variation of an individual resistance cell affects the total resistance of the reference cells.

Compared with some approaches, the present disclosure reduces fluctuation, induced by the variations of the reference cells, in reference currents by coupling all the reference cells in different columns together. Alternatively stated, each sense amplifier is not merely coupled to a small number of reference cells arranged in the same column, but also further coupled to the reference cells which are coupled to other sense amplifiers in the memory cells. Accordingly, the variations of the reference cells further diminish. Based on some experimental results of the present disclosure, the variation of the reference current per sigma decreases from about 4% to about 0.8% when a number of merged sense amplifiers increases from about 2 to about 38. In addition, if one of a state of reference cell redistributes (i.e., having an inaccurate resistance value), the variation of the reference current per sigma decreases from about 28% to about 1.5% when a number of merged sense amplifiers increases from about 2 to about 38. Based on discussion above, with the configurations of the present disclosure, a variation of reference currents provided for sense amplifiers is significantly reduced.

The configurations of FIG. 1 are given for illustrative purposes. Various implements of the present disclosure are within the contemplated scope of the present disclosure. For example, in some embodiments, the number of merged reference cells/sense amplifiers is more than 4, as shown in FIGS. 2, 6, 9, and 11-14. A person skilled in the art can utility the present disclosure with different numbers of merged reference cells/sense amplifiers according to the actual implements.

Figure 2:
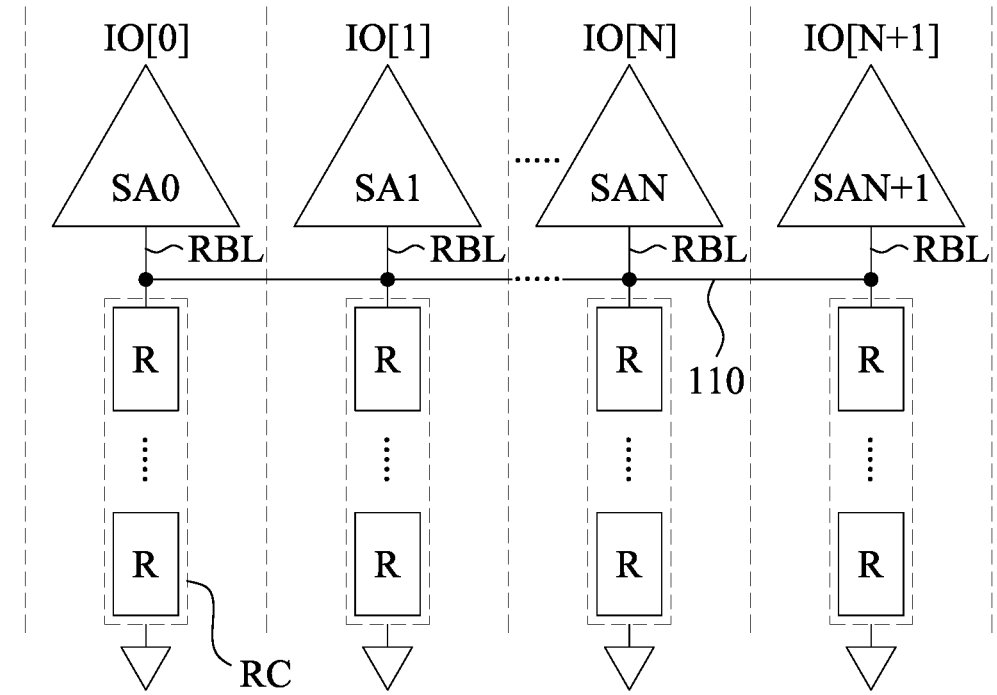
FIG. 2 is a schematic diagram of the memory device in accordance with other embodiments of the present disclosure.

Reference is now made to FIG. 2. FIG. 2 is a schematic diagram of a memory device 200 in accordance with various embodiments of the present disclosure. With respect to the embodiments of FIG. 1, like elements in FIG. 2 are designated with the same reference numbers for ease of understanding. The specific operations of similar elements, which are already discussed in detail in above paragraphs, are omitted herein for the sake of brevity.

Compared with the memory device 100 in FIG. 1, the memory device 200 further includes sense amplifiers SA0-SAN+1. The sense amplifiers SA0-SAN+1 are configured with respect to, for example, the sense amplifiers SA0-SA3. For illustrations, the sense amplifiers SA0-SAN+1 are coupled to each other through the connection line 110.

As shown in FIG. 2, the reference cells RC further includes several resistive elements R. For example, the resistive elements R are coupled to each other in series and coupled to the sense amplifiers SA0. The configurations of the sense amplifiers SA1-SAN+1 are similar to that of the sense amplifier SA0. Alternatively stated, each of the sense amplifiers SA0-SAN+1 is coupled to the resistive elements R in different columns.

In some approaches, there is only one resistive element in each of the reference cell. Therefore, a variation of the resistance element induces a corresponding significant fluctuation in a reference current. In contrast, with the configurations of the present disclosure, more than one of resistive elements are coupled in series and the series of resistive elements are further coupled in parallel. Accordingly, the variations of the resistive elements in the reference cells are averaged and further diminish.

The configurations of FIG. 2 are given for illustrative purposes. Various implements of the present disclosure are within the contemplated scope of the present disclosure. For example, in some embodiments, there is no reference cell RC in the columns COLUMN1-COLUMNN+1 which the sense amplifiers SA1-SAN+1 are placed, and a number of the resistive elements R in the reference cell RC in the column which the sense amplifier SA0 is placed is N+2. Alternatively stated, the resistive elements R are placed in only column COLUMN0 of all the columns. In various embodiments, at least two columns in the memory device 200 include resistive elements R.

Figure 3:
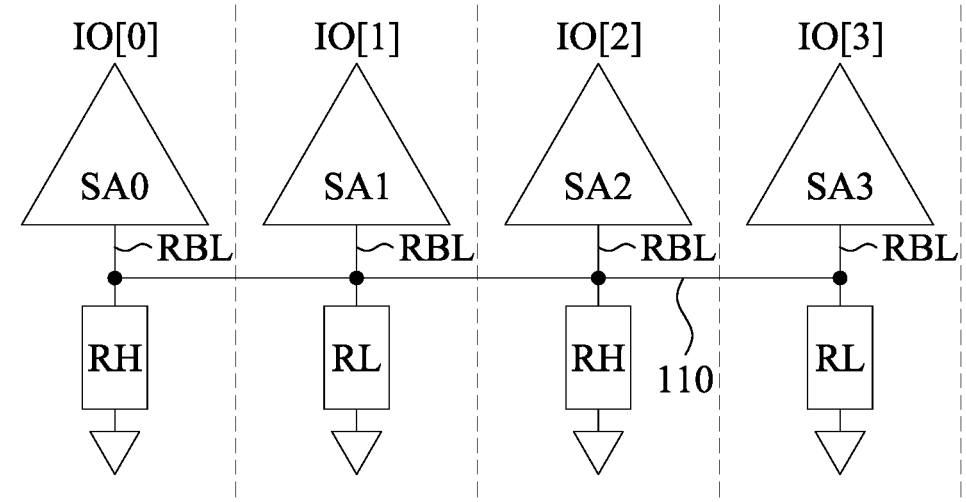
FIG. 3 is a schematic diagram of the memory device in accordance with other embodiments of the present disclosure.

Reference is now made to FIG. 3. FIG. 3 is a schematic diagram of a memory device 300 in accordance with various embodiments of the present disclosure. With respect to the embodiments of FIGS. 1-2, like elements in FIG. 3 are designated with the same reference numbers for ease of understanding.

Compared with the memory device 200 of FIG. 2, instead of the resistive elements R having substantially the same resistance, the resistive elements R includes resistive elements RH and RL in FIG. 3. In some embodiments, each of the resistive elements RH have a resistance corresponding to the high logic state of the memory cells, and each of the resistive elements RL have a resistance corresponding to the low logic state of the memory cells. The resistance of the resistive elements RH is higher than the resistance of the resistive elements RL. In some embodiments, a number of the resistive elements RH equals a number of the resistive elements RL.

As shown in FIG. 3, one of the resistive elements RH is coupled in parallel with and between two of resistive elements RL. For illustration, one of the resistive elements RH and the sense amplifier SA2 are arranged in the same column, and two resistive elements RL are arranged in adjacent columns. Similarly, one of the resistive elements RL and the sense amplifier SA1 are arranged in the same column, and two resistive elements RH are arranged in adjacent columns. Alternatively stated, the resistive elements RH and RL are alternately arranged in the columns. In some embodiments, the sense amplifiers SA0-SA3 are categorized into two groups. The first group including, for example, the sense amplifiers SA0 and SA2, and the resistive elements RH are arranged in the same columns. The second group including, for example, the sense amplifiers SA1 and SA3, and the resistive elements RL are arranged in the same columns. The first and second groups of the sense amplifiers are arranged alternately in the memory device 300. Alternatively stated, one of the first groups of the sense amplifiers is interposed between two of the second groups of the sense amplifiers.

The configurations of FIG. 3 are given for illustrative purposes. Various implements of the present disclosure are within the contemplated scope of the present disclosure. For example, in some embodiments, the first group of sense amplifiers includes the sense amplifiers SA1 and SA3, and the second group of sense amplifiers includes the sense amplifiers SA0 and SA2. In various embodiments, the memory device 300 includes more than 4 columns, more than 4 sense amplifiers and more than 4 resistive elements.

Figure 4:
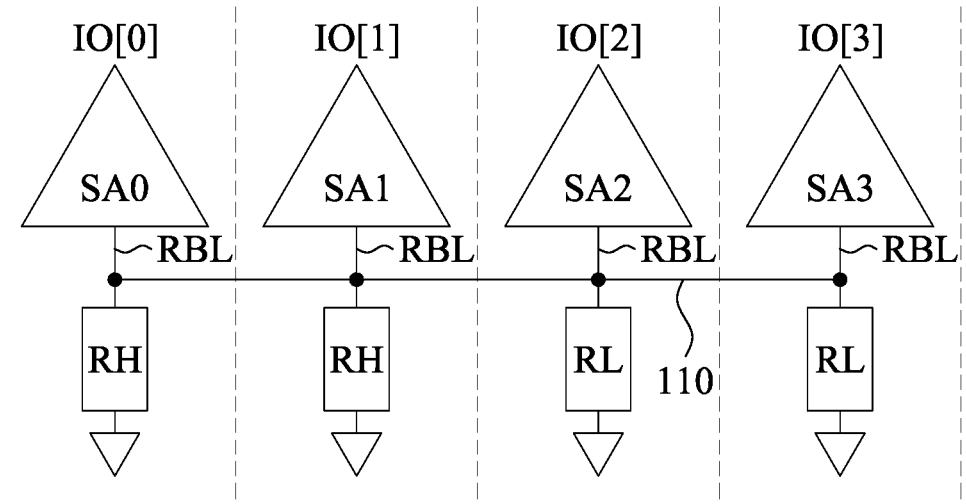
FIG. 4 is a schematic diagram of the memory device in accordance with other embodiments of the present disclosure.

Reference is now made to FIG. 4. FIG. 4 is a schematic diagram of a memory device 400 in accordance with various embodiments of the present disclosure. With respect to the embodiments of FIGS. 1-3, like elements in FIG. 4 are designated with the same reference numbers for ease of understanding.

Compared with FIG. 3, the sense amplifiers SA0-SA1 and the resistive elements RH are arranged in the same columns, and the sense amplifiers SA2-SA3 and the resistive elements RL are arranged in the same columns. Alternatively stated, in some embodiments, adjacent reference cells, each including at least one resistive element RH, are coupled in parallel with and arranged next to adjacent reference cells, each including at least one resistive element RL.

The configurations of FIG. 4 are given for illustrative purposes. Various implements of the present disclosure are within the contemplated scope of the present disclosure. For example, in some embodiments, the memory device 400 includes more than 4 columns, more than 4 sense amplifiers and more than 4 resistive elements. There are alternately arranged resistive elements RH and RL between the adjacent resistive elements RH and the adjacent resistive elements RL, and the number of the resistive elements RH and the number of the resistive elements RL are the same.

Figure 5:
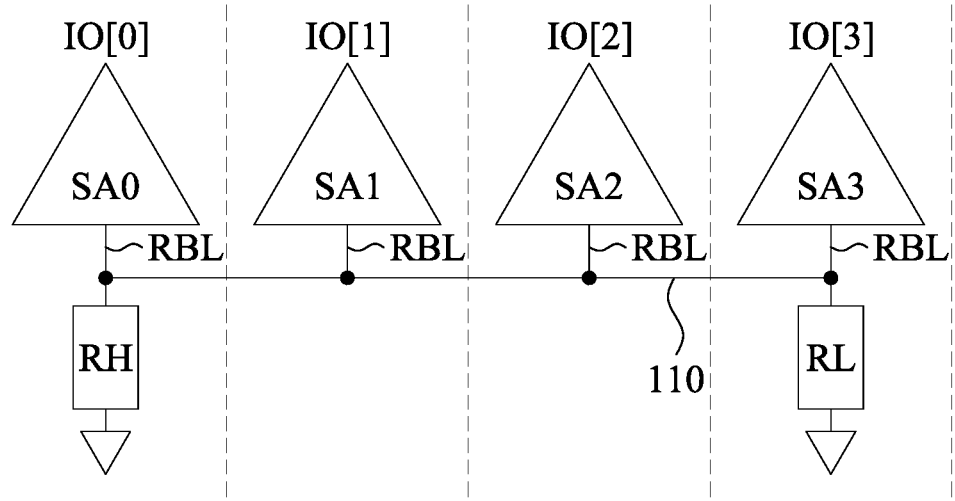
FIG. 5 is a schematic diagram of a memory device in accordance with various embodiments of the present disclosure.

Reference is now made to FIG. 5. FIG. 5 is a schematic diagram of a memory device 500 in accordance with various embodiments of the present disclosure. With respect to the embodiments of FIGS. 1-4, like elements in FIG. 5 are designated with the same reference numbers for ease of understanding.

Compared with FIG. 4, instead of arranging reference cells in each column, there are no reference cells in the columns in which the sense amplifiers SA1-SA2 are arranged. Accordingly, the sense amplifiers SA0-SA3 share the resistive element RH in the column COLUMN0 and the resistive element RL in the column COLUMN3.

The configurations of FIG. 5 are given for illustrative purposes. Various implements of the present disclosure are within the contemplated scope of the present disclosure. For example, in some embodiments, the resistive element RL is arranged in the column COLUMN2. The number of the resistive elements RH and the number of the resistive elements RL are the same.

Figure 6:
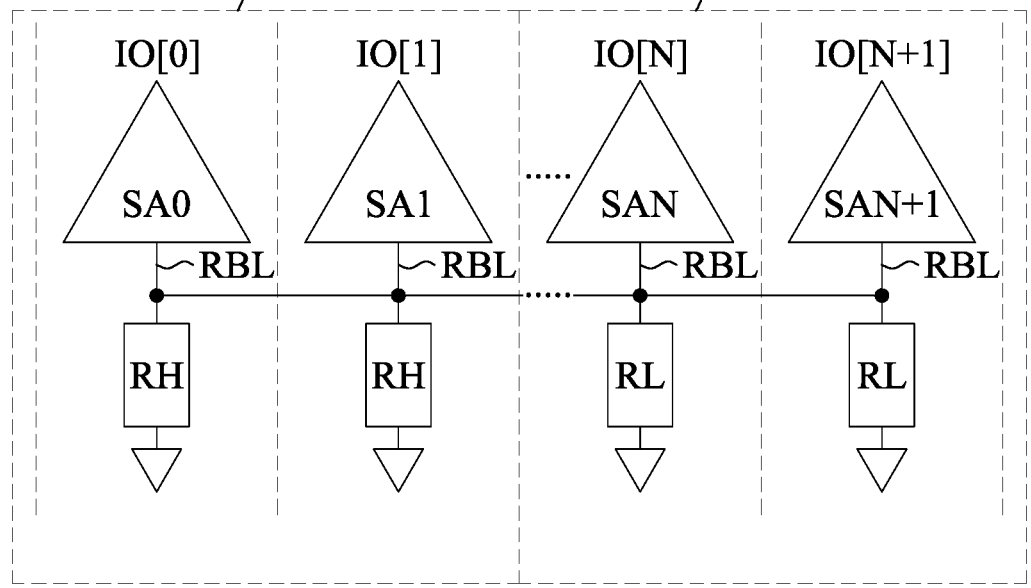
FIG. 6 is a schematic diagram of the memory device in accordance with other embodiments of the present disclosure.

Reference is now made to FIG. 6. FIG. 6 is a schematic diagram of a memory device 600 in accordance with various embodiments of the present disclosure. With respect to the embodiments of FIGS. 1-5, like elements in FIG. 6 are designated with the same reference numbers for ease of understanding.

Compared with FIG. 4, the memory device 600 further includes sense amplifiers SA0-SAN+1 coupled with the resistive elements RH and RL. There is one resistive element RH or RL arranged in each column in the memory device 600. For illustration, the memory device 600 further includes regions 610-620. A group of the sense amplifiers including, for example, the sense amplifiers SA0-SA1, are included in the region 610, and the other group of the sense amplifiers including, for example, the sense amplifiers SAN-SAN+1 are included in the region 620. In some embodiments, a total of N+2 sense amplifiers are included in the memory device 600, N being a positive integer. A number of (N+2)/2 sense amplifiers are arranged in the region 610, while the rest of the sense amplifiers are arranged in the region 620.

The configurations of FIG. 6 are given for illustrative purposes. Various implements of the present disclosure are within the contemplated scope of the present disclosure. For example, in some embodiments, each sense amplifier is arranged with more than one of resistive elements coupled in series in one of the columns. The number of the resistive elements RH and the number of the resistive elements RL are the same.

Figure 7:
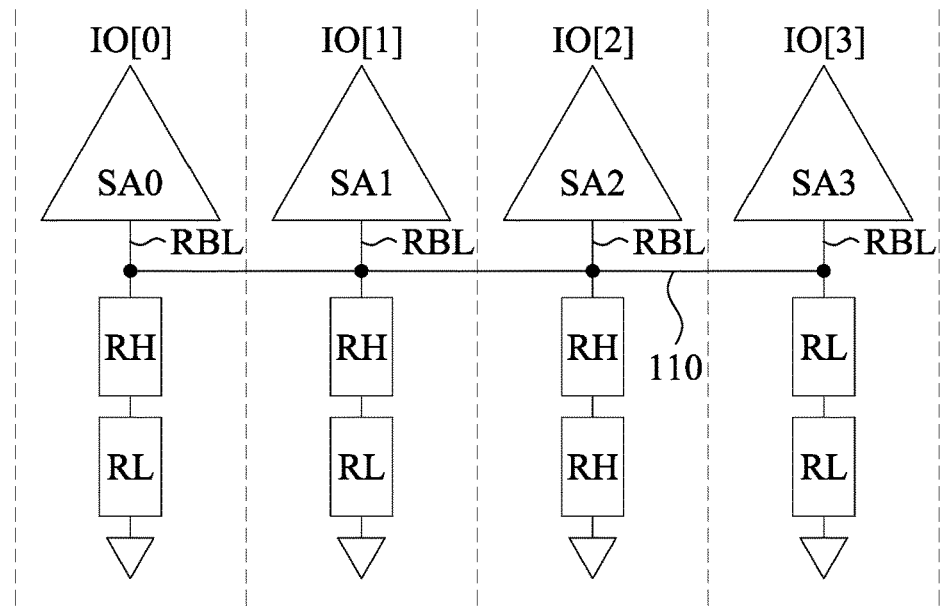
FIG. 7 is a schematic diagram of the memory device in accordance with other embodiments of the present disclosure.

Reference is now made to FIG. 7. FIG. 7 is a schematic diagram of a memory device 700 in accordance with various embodiments of the present disclosure. With respect to the embodiments of FIGS. 1-6, like elements in FIG. 7 are designated with the same reference numbers for ease of understanding.

Compared with FIG. 3, each of the sense amplifiers SA0-SA3 is arranged with at least one resistive element RH, at least one resistive element RL, or the combinations thereof, and a number of the resistive elements RH equals a number of the resistive elements RL in the memory device 700. Alternatively stated, some of the sense amplifiers SA0-SA3 are arranged with different numbers of the resistive elements RH and RL in a column.

In some embodiments, the at least one resistive element RH includes multiple resistive elements RH, and the at least one resistive element RL includes multiple resistive elements RL. For illustration, as shown in FIG. 6, the sense amplifiers SA0 and SA1 are separately arranged with combinations of one resistive element RH and one resistive element RL in columns. The sense amplifier SA2 and two resistive elements RH are arranged in the column COLUMN2. The sense amplifier SA3 and two resistive elements RL are arranged in the column COLUMN3. Accordingly, the sense amplifier SA2 is arranged with a greater number of the resistive elements RH in one column than the sense amplifier SA3. In contrast, the sense amplifier SA3 is arranged with a greater number of the resistive elements RL in one column than the sense amplifier SA2.

The configurations of FIG. 7 are given for illustrative purposes. Various implements of the present disclosure are within the contemplated scope of the present disclosure. For example, in some embodiments, there are more than two resistive elements arranged in a column. The number of the resistive elements RH and the number of the resistive elements RL are the same.

Figure 8:
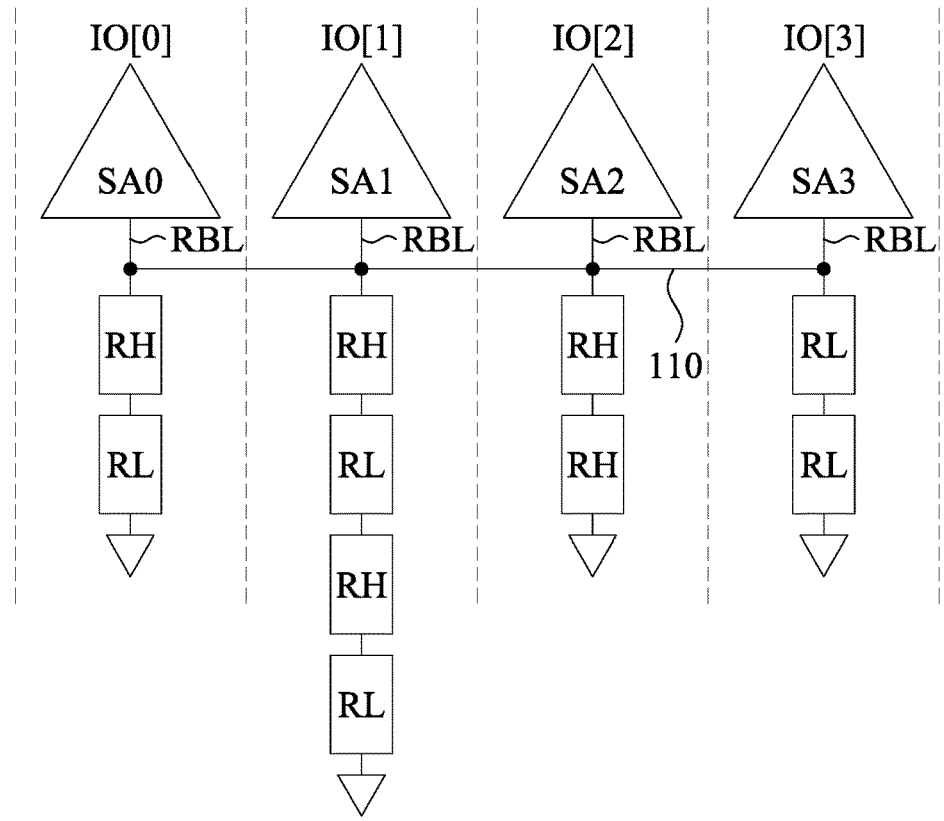
FIG. 8 is a schematic diagram of a memory device in accordance with various embodiments of the present disclosure.

Reference is now made to FIG. 8. FIG. 8 is a schematic diagram of a memory device 800 in accordance with various embodiments of the present disclosure. With respect to the embodiments of FIGS. 1-7, like elements in FIG. 8 are designated with the same reference numbers for ease of understanding.

Compared with FIG. 7, instead of having an equal number of the resistive element in each column, the memory device 800 includes different numbers of the resistive elements in each column. As illustratively shown in FIG. 8, there are two resistive elements in the columns COLUMN0, COLUMN2 and COLUMN3, and there are four resistive elements in the column COLUMN1. Alternatively stated, one of sense amplifiers SA0-SA3 is arranged in one column with one reference cell including a first number of resistive elements, and the another sense amplifier is arranged in another column with another reference cell including a second number of resistive elements, in which the first number is different from the second number.

The configurations of FIG. 8 are given for illustrative purposes. Various implements of the present disclosure are within the contemplated scope of the present disclosure. For example, in some embodiments, there is more than one sense amplifier arranged with a different number of resistive elements in columns, with respect to the rest of the sense amplifiers in the memory device 800. The number of the resistive elements RH and the number of the resistive elements RL are the same.

Figure 9:
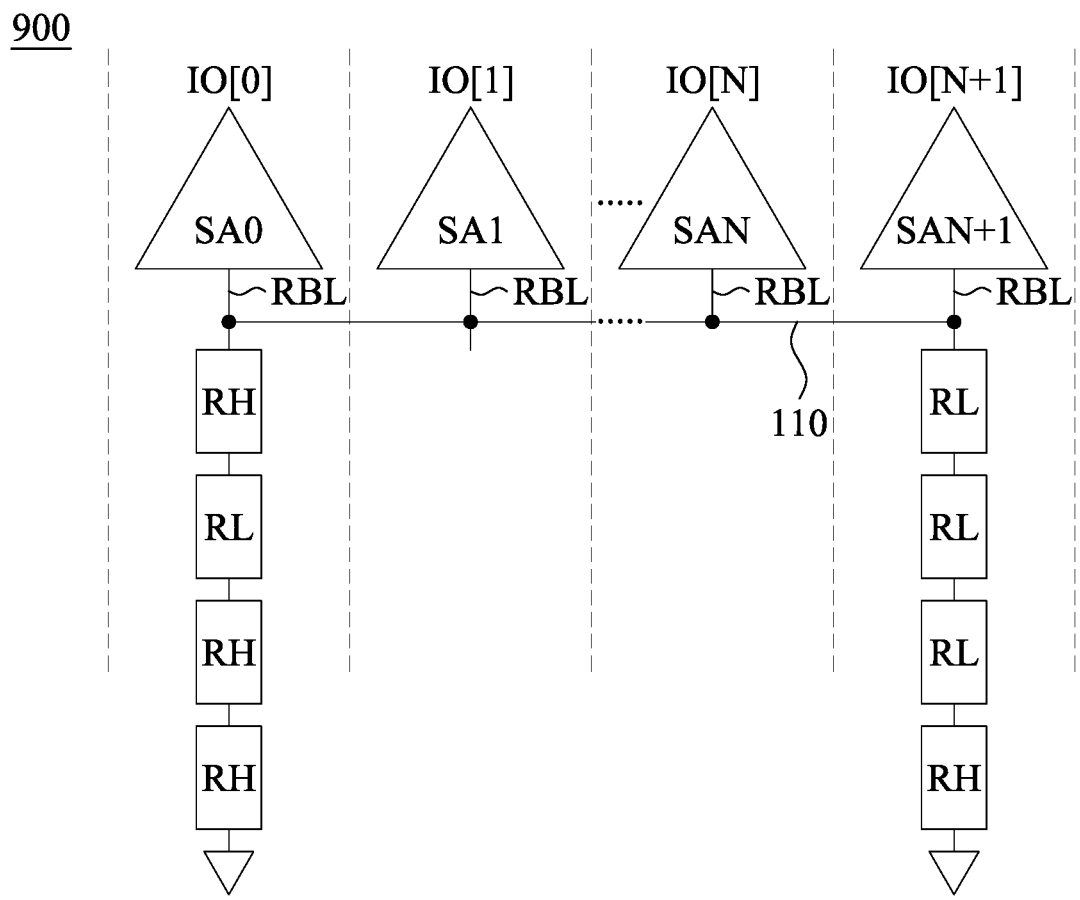
FIG. 9 is a schematic diagram of a memory device in accordance with various embodiments of the present disclosure.

Reference is now made to FIG. 9. FIG. 9 is a schematic diagram of a memory device 900 in accordance with various embodiments of the present disclosure. With respect to the embodiments of FIGS. 1-8, like elements in FIG. 9 are designated with the same reference numbers for ease of understanding.

Compared with FIG. 5, the memory device 900 further includes sense amplifiers SA0-SAN+1. For illustration, the sense amplifier SA0 is further arranged with a combination of the resistive elements RH and RL in the same column, and the sense amplifier SAN+1 is also arranged with another combination of the resistive elements RH and RL in the same column. In some embodiments, a number of the resistive elements RH equals a number of the resistive elements RL in the memory device 900. There are no resistive elements arranged in columns between the sense amplifiers SA0 and SAN+1.

The configurations of FIG. 9 are given for illustrative purposes. Various implements of the present disclosure are within the contemplated scope of the present disclosure. For example, in some embodiments, there are more than four resistive elements arranged with the sense amplifier SA0 or/and SAN+1. The number of the resistive elements RH and the number of the resistive elements RL are the same.

Figure 10B:
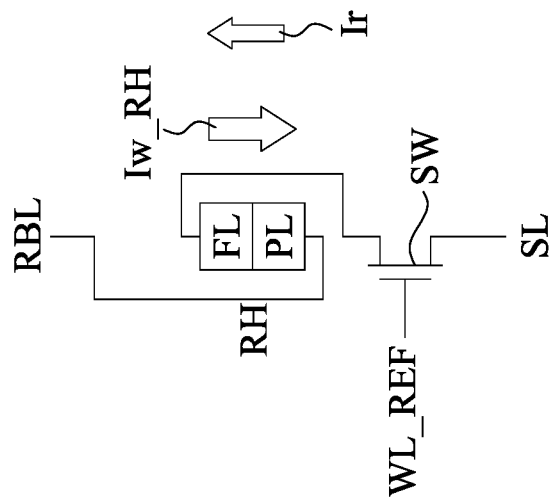
FIGS. 10A-10B are schematic diagrams of resistive elements having a high resistance value and a low resistance value in accordance with various embodiments of the present disclosure.
Figure 10A:
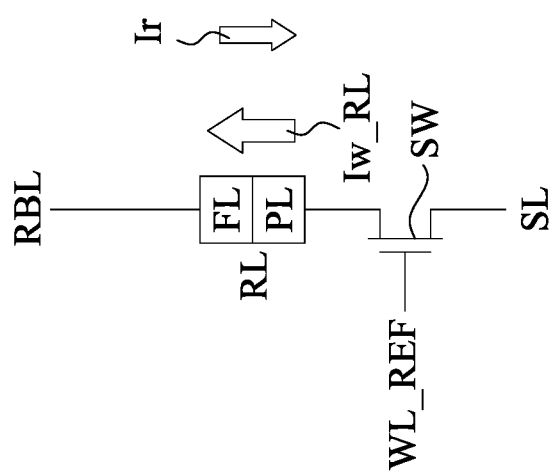

FIGS. 10A-10B are schematic diagrams of the resistive elements RH and RL in accordance with various embodiments of the present disclosure. With respect to the embodiments of FIGS. 1-9, like elements in FIGS. 10A-10B are designated with the same reference numbers for ease of understanding.

Reference is now made to FIG. 10A. In some embodiments, the resistive element RL is implemented by a MRAM element. The MRAM element is often based on a magnetic tunnel junction (MTJ) element. For illustration, the resistive element RL includes a pinned layer PL and a free layer FL. In some embodiments, the pinned layer PL is referred to as the pinned layer portion in the reference cell, and the free layer is referred to as the free layer portion in the reference cell. In some embodiments, the resistive element RL includes a tunneling barrier layer or an insulator layer sandwiched between the free layer FL and the pinned layer PL. The magnetization of the free layer FL is free to rotate to point in one of two directions and switched using spin-torque transfer (STT). For the pinned layer PL, an anti-ferromagnetic layer is used to fix, or pin, its magnetization in a particular direction. The free layer FL is coupled to the reference data line RBL which provides the free layer FL with a voltage in a read or write operation. The pinned layer PL is coupled to a drain of a switching device SW.

The switching device SW is configured to read from, or write to the resistive element RL. Embodiments of the switching device SW include a metal oxide semiconductor (MOS) transistor, an MOS diode, and/or a bipolar transistor.

A gate of the switching device SW is coupled to a reference word line WL_REF, which activates the resistive element RL for a read or write operation. A source of the switching device SW is coupled to a source line SL, which drives the pinned layer PL with a voltage in a read or write operation when activated by the reference word line WL_REF.

Data in the resistive element RL is represented by the magnetization direction of the free layer FL relative to the pinned layer PL. In the embodiments of FIG. 10A, the magnetization of the free layer FL and the pinned layer PL are parallel and the magnetic moments have the same polarity, the resistance of the resistive element RL is low. Typically, this is designated a "0" state.

In a read operation to the resistive element RL, the data (i.e., a bit value) stored in the resistive element RL is read by measuring a read current Ir as determined by the resistance of the resistive element RL. In some embodiments, the read current Ir is generated by applying a positive voltage to the reference data line RBL and turning on the switching device SW from the reference word line WL_REF.

A voltage across the resistive element RL from the free layer FL to the pinned layer PL may be represented by a voltage $V_{MTJ}$ In a write operation to switch the resistive element RL from "0" to the "1" state, the voltage $V_{MTJ}$ is negatively biased and a write current Iw_RL is generated by applying a negative voltage to the reference data line RBL, tying the source line SL to ground, and activating the switching device SW through the reference word line WL_REF, in some embodiments. As the voltage $V_{MTJ}$ is sufficiently negative, a sufficient number of conduction electrons may transfer sufficient angular momentum to the free layer FL to switch the magnetic moments of the free layer FL to be anti-parallel to the magnetic moments of the pinned layer PL. The magnetic moments of the free layer FL become anti-parallel to those of the pinned layer PL, and the resistance of the resistive element RL rises from the low resistance to the high resistance.

As discussed above, the directions of the read current Ir and the write current Iw_RL are different. Accordingly, in some embodiments, it's difficult to disturb the state of the resistive element RL during the read operation.

Reference is now made to FIG. 10B. For illustration, the resistive element RH is also implemented by a MTJ device. In some embodiments, the magnetization of the free layer FL and the pinned layer PL are anti-parallel and the magnetic moments have different polarity, the resistance of the resistive element RH is high. Typically, this is designated a "1" state.

Compared with the resistive element RL of FIG. 10A, the resistive element RH has different connection configuration. As illustratively shown in FIG. 10B, instead of being coupled to the reference data line RBL, the free layer FL of the resistive element RH is coupled to the drain of the switching device SW. The pinned layer PL of the resistive element RH is coupled to the reference data line RBL.

In a read operation to the resistive element RH, the read current Ir is generated by applying a positive voltage to the reference data line RBL and turning on the switching device SW from the reference word line WL_REF. Accordingly, the read current Ir is upward direction, as shown in FIG. 10B.

In a write operation to switch the resistive element RH from "1" to the "0" state, the voltage $V_{MTJ}$ crossing the resistive element RH is positively biased and a write current Iw_RH is generated by applying a positive voltage to the reference data line RBL, tying the source line SL to ground, and activating the switching device SW through the reference word line WL_REF, in some embodiments. In some embodiments, the write current Iw_RH from the free layer FL to the pinned layer PL is downward, as shown in FIG. 10B. The positive $V_{MTJ}$ causes conduction electrons to travel from the pinned layer PL to the free layer FL. As the voltage $V_{MTJ}$ is sufficiently positive, a sufficient number of conduction electrons transfer sufficient angular momentum to the free layer FL to switch the magnetic moments of the free layer FL to be parallel to the magnetic moments of the pinned layer PL. The magnetic moments of the free layer FL become parallel to those of the pinned layer PL, and the resistance of the resistive element RH drops from the high resistance to the low resistance.

As discussed above, the directions of the read current Ir and the write current Iw_RH are different. Accordingly, in some embodiments, it's difficult to disturb the state of the resistive element RH during the read operation.

In some approaches, resistive elements having a high resistance (i.e., a resistance corresponding to a high logic state) have the same connection configuration as shown in FIG. 10A. In a write operation to switch the resistive elements from "1" to the "0" state, the voltage $V_{MTJ}$ is positively biased and the write current is generated by applying a positive voltage to a reference data line, tying the source line to ground, and activating a switching device through a reference word line. Accordingly, the write current is downward. However, in a read operation, a read current is generated as the read current Ir of FIG. 10A. Alternatively stated, the write and read currents flow in the same direction. In such arrangements of the approaches, although magnitude levels of the write and read currents are different, the read current causes the resistive element programmed during the read operation sometimes. As a result, some states of the resistive elements are disturbed in the read operation and variations of the resistive elements rise.

In contrast, with the configurations of the present disclosure, the directions of the read current Ir and the write current Iw_RH are different. By utilizing a so called "reverse-connected" way for connection as shown in FIG. 10B, read disturbances of the resistive elements having the high resistance are prevented. Accordingly, variations, induced by the read disturbances, of the resistive elements are much smaller, compared with some approaches.

The configurations of FIGS. 10A-10B are given for illustrative purposes. Various implements of the present disclosure are within the contemplated scope of the present disclosure. For example, in some embodiments, Iw_RL/Iw_RH is generated by applying a positive voltage to the source line SL, and tying the reference data line RBL to ground.

Figure 11:
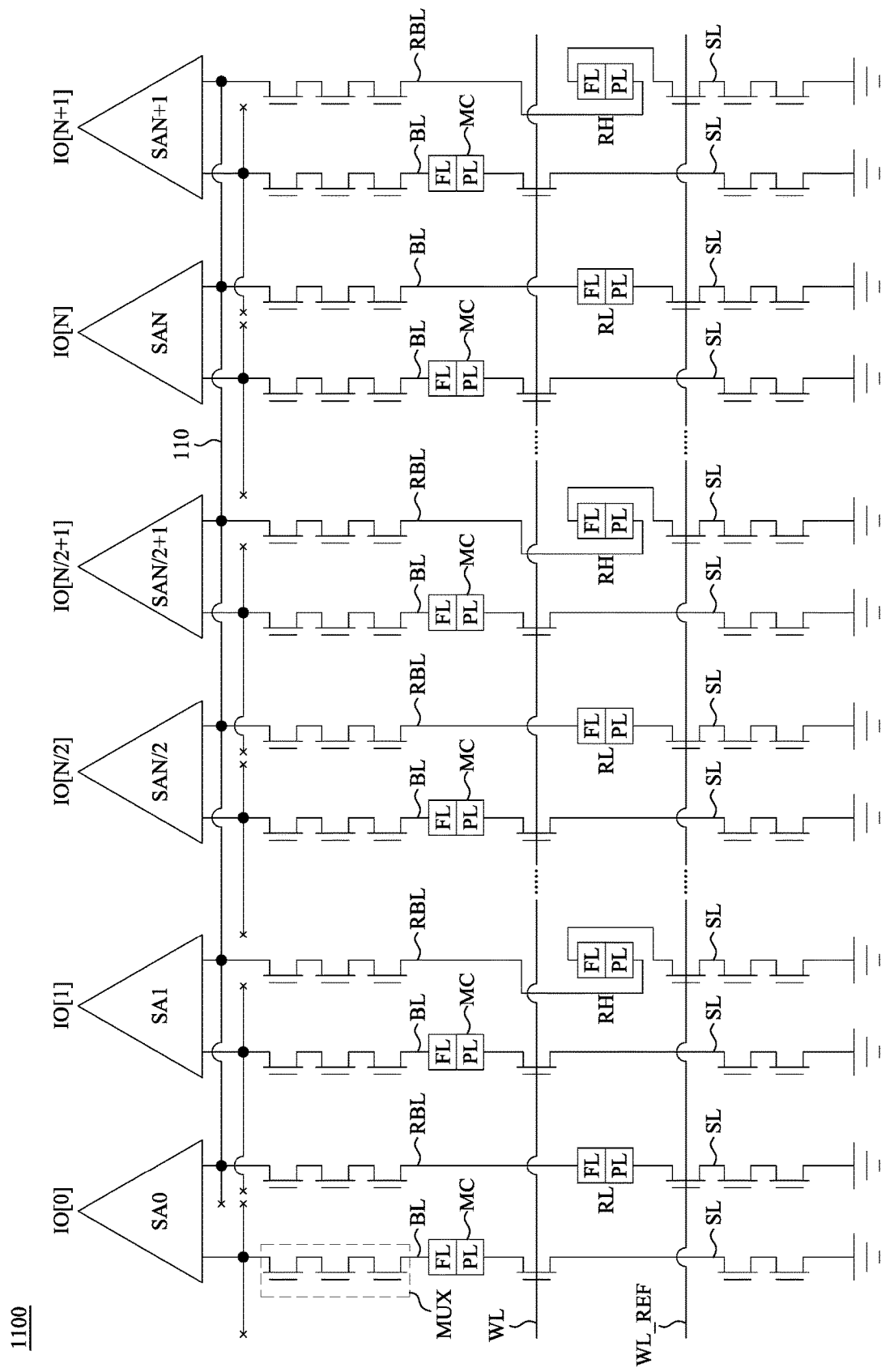
FIG. 11 is a schematic diagram of a memory device in accordance with various embodiments of the present disclosure.

Reference is now made to FIG. 11. FIG. 11 is a schematic diagram of a memory device 1100 in accordance with various embodiments of the present disclosure. With respect to the embodiments of FIGS. 1-10B, like elements in FIG. 11 are designated with the same reference numbers for ease of understanding.

As shown in FIG. 11, the memory device 1100 includes multiple sense amplifiers SA0-SAN+1, multiple memory cells MC, the resistive elements RH and RL configured as reference cells. The sense amplifiers SA0-SAN+1 are coupled to each other through the connection line 110. In some embodiments, the sense amplifiers SA0-SAN+1 are configured with respect to, for example, the sense amplifiers SA0 of FIG. 1. The resistive elements RL are configured with respect to, for example, the resistive element RL of FIG. 10A. The resistive elements RH are configured with respect to, for example, the resistive element RH of FIG.

10B. In some embodiments, the memory cells MC are implemented by MTJ devices.

For illustration, each of the sense amplifiers SA0-SAN+1 is coupled to one memory cell MC through a multiplexer MUX and a data line BL. Each of the memory cells MC is further coupled to a terminal of a switching device which has a gate coupled to a word line WL for being activated. Another terminal of the switching device is coupled to ground through a source line and several switches.

As illustratively shown in FIG. 11, each of the resistive elements RH and RL is coupled between one of the multiplexer MUX and a switching device SW. The resistive elements RH and RL are alternately arranged. Specifically, even sense amplifiers (i.e., the sense amplifiers SA0, SAN/2, SAN) are arranged with the resistive elements RL in columns, and odd sense amplifiers (i.e., the sense amplifiers SA1, SAN/2+1, SAN+1) are arranged with the resistive elements RH in columns. Alternatively stated, the sense amplifiers SA0-SAN+1 are categorized into two groups. The first groups of sense amplifiers (i.e., the odd sense amplifiers) are firstly coupled to pinned layers PL in the reference cells through the reference data lines RBL and secondly coupled to free layers FL coupled to ground though the source lines SL. The second groups of sense amplifiers (i.e., the even sense amplifiers) are firstly coupled to free layers FL in the reference cells through the reference data lines RBL and secondly coupled to pinned layers PL coupled to ground though the source lines SL.

The configurations of FIG. 11 are given for illustrative purposes. Various implements of the present disclosure are within the contemplated scope of the present disclosure. For example, in some embodiments, the resistive elements RL and RH are arranged randomly in columns. In various embodiments, the even sense amplifiers (i.e., the sense amplifiers SA0, SAN/2, SAN) are arranged with the resistive elements RH in columns, and odd sense amplifiers (i.e., the sense amplifiers SA1, SAN/2+1, SAN+1) are arranged with the resistive elements RL in columns. The number of the resistive elements RH and the number of the resistive elements RL are the same.

Figure 12:
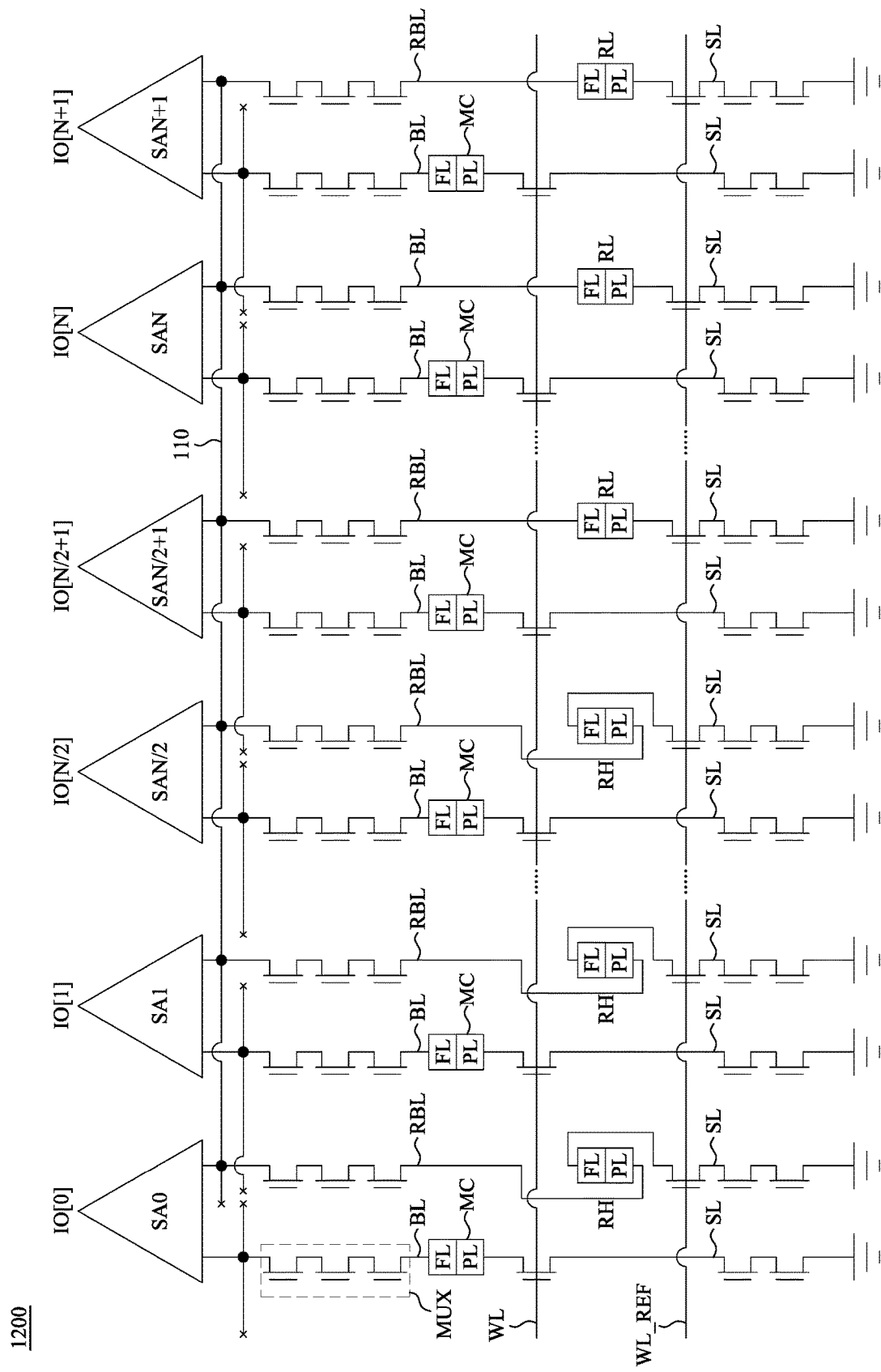
FIG. 12 is a schematic diagram of the memory device in accordance with other embodiments of the present disclosure.

Reference is now made to FIG. 12. FIG. 12 is a schematic diagram of a memory device 1200 in accordance with various embodiments of the present disclosure. With respect to the embodiments of FIGS. 1-11, like elements in FIG. 12 are designated with the same reference numbers for ease of understanding.

Compared with FIG. 12, instead of alternately arranging the resistive elements RH and RL, the resistive elements RH are arranged in the sense amplifiers SA0-SAN/2 in one region of the memory device 1200, and the resistive elements RL are arranged in the sense amplifiers SAN/2-SAN+1 in another region of the memory device 1200.

The configurations of FIG. 12 are given for illustrative purposes. Various implements of the present disclosure are within the contemplated scope of the present disclosure. For example, in some embodiments, some of the sense amplifiers interposed between the sense amplifiers SA1 and SAN+1 are not arranged with any resistive elements in columns. The number of the resistive elements RH and the number of the resistive elements RL are the same.

Figure 13:
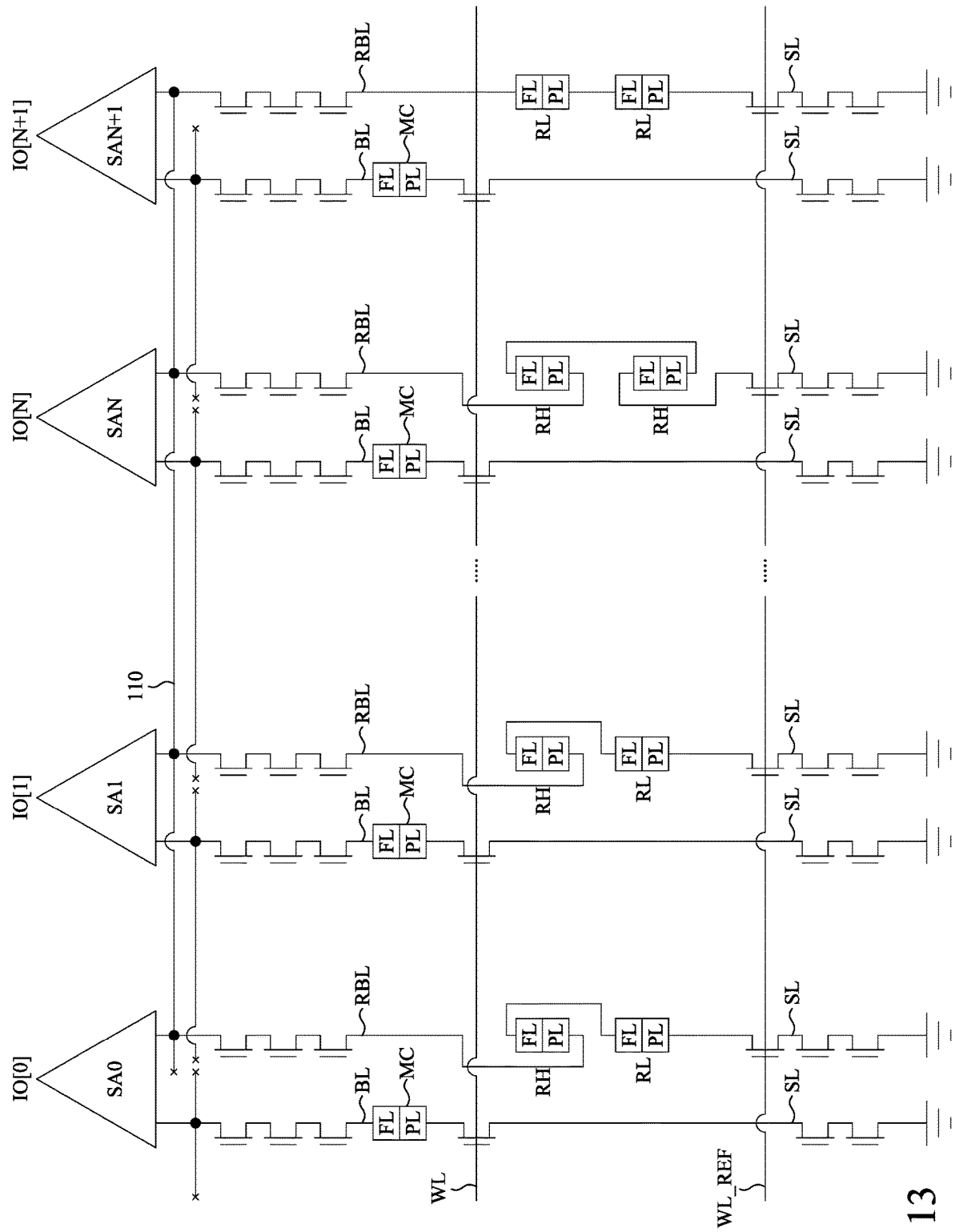
FIG. 13 is a schematic diagram of the memory device in accordance with other embodiments of the present disclosure.

Reference is now made to FIG. 13. FIG. 13 is a schematic diagram of a memory device 1300 in accordance with various embodiments of the present disclosure. With respect to the embodiments of FIGS. 1-12, like elements in FIG. 13 are designated with the same reference numbers for ease of understanding.

Compared with FIG. 7, the resistive elements RH and RL in memory device 1300 include MTJ devices. For illustration, in one case of the resistive elements RH and RL coupled in series, the pinned layers PL of the resistive elements RH and RL are coupled to the reference data line RBL and the source line SL respectively, and the free layers FL of the resistive elements RH and RL are coupled to each other.

In another case of the resistive elements RH coupled in series, the pinned layer PL of the resistive element RH arranged closer to the sense amplifier SAN is coupled to the reference data line RBL. The free layer FL of the resistive element RH arranged closer to the sense amplifier SAN is coupled to the pinned layer PL of the resistive element RH arranged away from the sense amplifier SAN.

In yet another case of the resistive elements RL coupled in series, the free layer FL of the resistive element RL arranged closer to the sense amplifier SAN+1 is coupled to the reference data line RBL. The pinned layer PL of the resistive element RL arranged closer to the sense amplifier SAN+1 is coupled to the free layer FL of the resistive element RL arranged away from the sense amplifier SAN+1.

The configurations of FIG. 13 are given for illustrative purposes. Various implements of the present disclosure are within the contemplated scope of the present disclosure. For example, in some embodiments, the sense amplifier SA0 is firstly coupled to the free layer FL and the pinned layer PL of the resistive element RL and secondly coupled to the pinned layer PL and the free layer FL of the resistive element RH. Alternatively stated, either the resistive element RH or RL is placed closer to a sense amplifier. The number of the resistive elements RH and the number of the resistive elements RL are the same.

Figure 14:
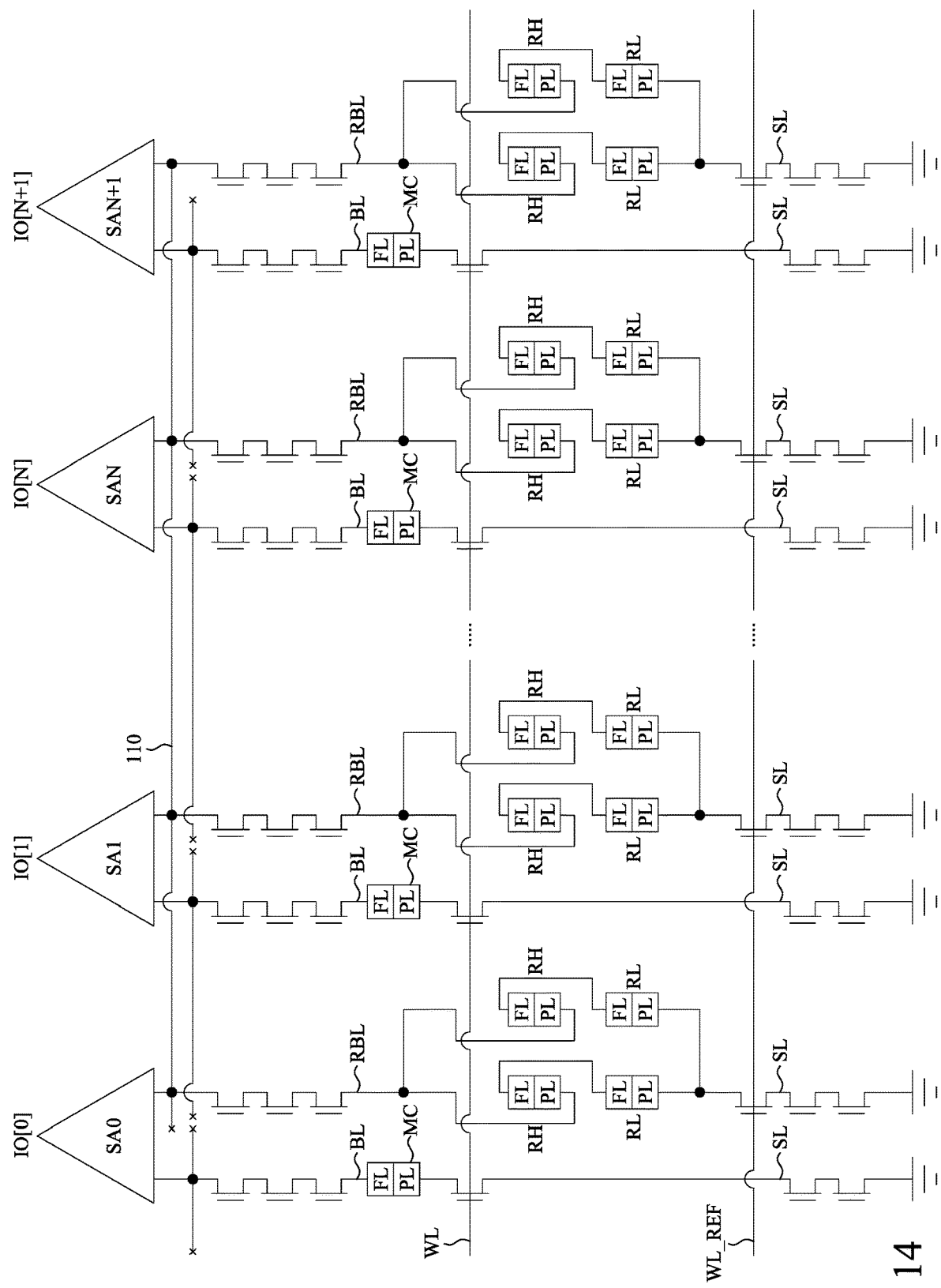
FIG. 14 is a schematic diagram of a memory device in accordance with various embodiments of the present disclosure.

Reference is now made to FIG. 14. FIG. 14 is a schematic diagram of a memory device 1400 in accordance with various embodiments of the present disclosure. With respect to the embodiments of FIGS. 1-13, like elements in FIG. 14 are designated with the same reference numbers for ease of understanding.

Compared with FIG. 13, the memory device 1400 further includes sense amplifiers SA0-SAN+1, and the resistive elements RH and RL are further coupled in parallel and arranged between one multiplexer and one switching device. As illustratively shown in FIG. 14, taking the resistive elements RH and RL arranged in the same column as the sense amplifier SA0 as example, one resistive element RH and one resistive element RL are coupled in series and further coupled in parallel with another series of the resistive elements RH and RL. Specifically, the pinned layers of the resistive elements RH are coupled to the same reference data line RBL in parallel, and the pinned layers of the resistive elements RL are coupled in parallel to the same source line though the switching device.

The configurations of FIG. 14 are given for illustrative purposes. Various implements of the present disclosure are within the contemplated scope of the present disclosure. For example, in some embodiments, the sense amplifiers SA0-SAN/2 are arranged with all resistive elements RL in one region of the memory device 1400, and the sense amplifiers SAN/2+1-SAN+1 are arranged with all resistive elements RH in another region of the memory device 1400. The number of the resistive elements RH and the number of the resistive elements RL are the same.

Figure 15:
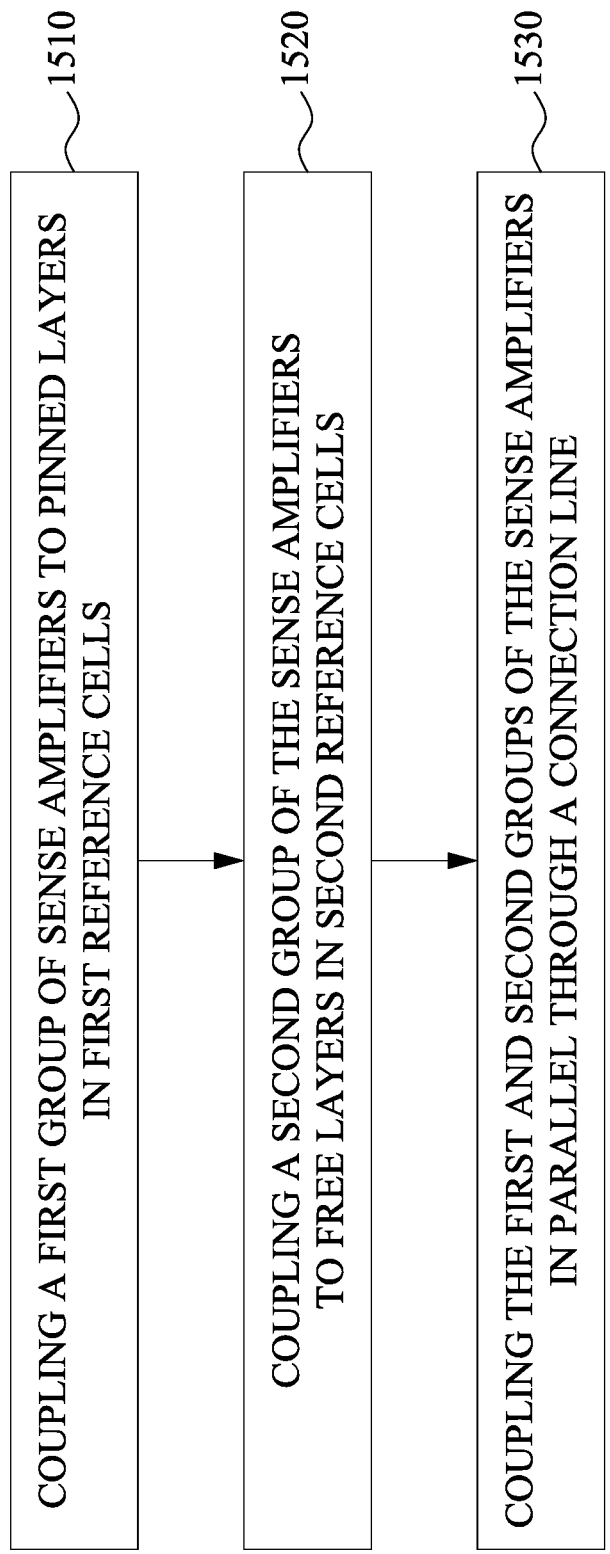
FIG. 15 is a flowchart of a method, in accordance with some embodiments of the present disclosure.

Reference is now made to FIG. 15. FIG. 15 is a flowchart of a method 1500, in accordance with some embodiments of the present disclosure. It is understood that additional operations can be provided before, during, and after the processes shown by FIG. 15, and some of the operations described below can be replaced or eliminated, for additional embodiments of the method. The order of the operations/processes may be interchangeable. Throughout the various views and illustrative embodiments, like reference numbers are used to designate like elements. The method 1500 includes operations 1510-1530 that are described below with reference to the memory devices 1100-1400 of FIGS. 11-14.

In operation 1510, the odd sense amplifiers of FIG. 11 are coupled to the pinned layers PL in the resistive elements RH (in reference cells). As shown in FIG. 11, the resistive elements RH and the odd sense amplifiers are arranged in the same columns.

In some embodiments, the method 1500 further includes the operation of coupling the resistive elements RH in series in one reference cell, as shown in FIG. 13. The resistive elements RH have resistances corresponding to the high logic state of the memory cell MC. A free layer FL of a first element of the resistive elements RH is coupled to a pinned layer of a second element of the resistive elements RH. The first element is arranged closer to the sense amplifiers SA0-SAN+1 than the second element.

In some embodiments, the method 1500 further includes the operation of coupling at least one resistive element RH and at least one resistive element RL in series in one reference cell, as shown in FIG. 13. A free layer FL of the at least one resistive element RH is coupled to a free layer FL of the at least one resistive element RL.

In operation 1520, the even sense amplifiers of FIG. 11 are coupled to the free layers FL in the resistive elements RL (in reference cells). As shown in FIG. 11, the resistive elements RL and the even sense amplifiers are arranged in the same columns.

In some embodiments, the method 1500 further includes the operation of coupling the resistive elements RL in series in one reference cell, as shown in FIG. 13.

In some embodiments, the method 1500 further includes the operation of alternately arranging the odd and even sense amplifiers in the memory device 1100, as shown in FIG. 11.

In operation 1530, the odd and even sense amplifiers are coupled in parallel through the connection line 110, as shown in FIGS. 1-14.

The configurations of FIG. 15 are given for illustrative purposes. Various implements of the present disclosure are within the contemplated scope of the present disclosure. For example, in some embodiments, the method 1500 further includes the operation of arranging an odd number of resistive elements with one sense amplifier in one column of a memory device. A number of the resistive elements RH and a number of the resistive elements RL in the memory device are the same.

As described above, the memory device in the present disclosure provides reference cells with reduced resistance variations by coupling the reference cells in parallel. A number of resistive elements having high resistances and a number of the resistive elements having low resistances in the reference cells are the same. Furthermore, by utilizing the reversed connection to couple the sense amplifier and a high resistive reference cell including MTJ devices, read disturbances are avoided. Accordingly, variations of the resistances of the reference cells are improved.

In some embodiments, a memory device is disclosed. The memory device includes a plurality of sense amplifiers, a plurality of memory cells, a plurality of data lines, a plurality of reference cells, and a connection line. The memory cells are coupled to a plurality of first inputs of the plurality of sense amplifiers respectively. The data lines are coupled to a plurality of second inputs of the plurality of sense amplifiers respectively. The reference cells are arranged in a plurality of columns respectively and coupled to the plurality of data lines respectively. Each of the plurality of reference cells includes a plurality of resistive elements. The connection line is coupled to the plurality of data lines. In a read mode, one of the sense amplifiers is configured to access the plurality of resistive elements arranged in at least one of the plurality of columns. In some embodiments, in the read mode, the one of the plurality of sense amplifiers is configured to access the plurality of resistive elements arranged in all of the plurality of columns. In some embodiments, the plurality of resistive elements include a first number of first resistive elements having a first resistance and a second number of second resistive elements having a second resistance. In some embodiments, the first resistance corresponds to a first logic value of the plurality of memory cells, and the second resistance corresponds to a second logic value of the plurality of memory cells. In some embodiments, the second number is equal to the first number. In some embodiments, each of the plurality of reference cells includes at least one first resistive element having a first resistance or at least one second resistive element having a second resistance, in which the first resistance is different from the second resistance. In some embodiments, the at least one first resistive element includes a plurality of first resistive elements. A first sense amplifier of the plurality of sense amplifiers and a first number of the the plurality of first resistive elements are arranged in one of the plurality of columns, and a second sense amplifier of the plurality of sense amplifiers and a second number of the plurality of first resistive elements are arranged in another one of the plurality of columns. In some embodiments, the second number is different from the first number.

Also disclosed is a memory device that includes a first sense amplifier, a first reference cell, a second sense amplifier, and a second reference cell. The first sense amplifier is arranged in a first column, is coupled to the first sense amplifier, and includes a first number of a plurality of resistive elements. The second sense amplifier is coupled to the first sense amplifier in parallel. The second reference cell is arranged in a second column, is coupled to the second sense amplifier, and includes a second number of the plurality of resistive elements. The second reference cell and the first reference cell are coupled in parallel, and the second number is different from the first number. In some embodiments, the plurality of resistive elements in the first reference cell include a first resistive element having a first resistance and a second resistive element having a second resistance, in which the first resistance is higher than the second resistance. In some embodiments, the plurality of resistive elements in the second reference cell include a plurality of third resistive elements having the first resistance and a plurality of fourth resistive elements having the second resistance. In some embodiments, the memory device further includes a third sense amplifier and a third reference cell. The third sense amplifier is coupled to the second sense amplifier in parallel. The third reference cell is arranged in a third column, is coupled to the third sense amplifier, and includes the first number of the plurality of resistive elements. The plurality of resistive elements in the third reference cell include a plurality of fifth resistive elements having the first resistance. In some embodiments, the memory device further includes a fourth sense amplifier and a fourth reference cell. The fourth sense amplifier is coupled to the third sense amplifier in parallel. The fourth reference cell is arranged in a fourth column, is coupled to the fourth sense amplifier, and includes the first number of the plurality of resistive elements. The plurality of resistive elements in the fourth reference cell include a plurality of sixth resistive elements having the second resistance. In some embodiments, in a read mode, one of the first sense amplifier, the second sense amplifier, the third sense amplifier, and the fourth sense amplifier is configured to access all of the plurality of resistive elements in the first reference cell, the second reference cell, the third reference cell, and the fourth reference cell.

Also disclosed is a memory device that includes a plurality of first sense amplifiers, a plurality of first reference cells, at least one second sense amplifier, and at least one second reference cell. The plurality of first reference cells are arranged in a plurality of first columns respectively. A plurality of pinned layer portions in the plurality of first reference cells are coupled to the plurality of first sense amplifiers respectively. The at least one second reference cell is arranged in at least one second column. The at least one free layer portion in the at least one second reference cell is coupled to the at least one second sense amplifier. In a read mode, the second sense amplifier is configured to access a plurality of resistive elements in each of the plurality of first reference cells. In some embodiments, in the read mode, the at least one second sense amplifier is further configured to access the at least one second reference cell. In some embodiments, the memory device further includes a plurality of first reference data lines. The plurality of first reference data lines are coupled between the plurality of first sense amplifiers and the plurality of first reference cells respectively. The plurality of pinned layer portions in the plurality of first reference cells are directly coupled to the first reference data lines respectively. In some embodiments, the memory device further includes at least one second reference data line. The at least one second reference data line is coupled between the at least one second sense amplifier and the at least one second reference cell. The at least one free layer portion in the at least one second reference cell is directly coupled to the at least one second reference data line. In some embodiments, one of the plurality of first reference cells includes a first resistive element having a first resistance and a second resistive element having a second resistance. The first resistance is higher than the second resistance. One of the plurality of pinned layer portions is in the first resistive element. In some embodiments, the at least one second reference cell includes a plurality of third resistive elements having the second resistance, and the at least one free layer portion is in one of the plurality of third resistive elements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of sense amplifiers;
a plurality of memory cells coupled to a plurality of first inputs of the plurality of sense amplifiers respectively;
a plurality of data lines coupled to a plurality of second inputs of the plurality of sense amplifiers respectively;
a plurality of reference cells arranged in a plurality of columns respectively and coupled to the plurality of data lines respectively, wherein the plurality of reference cells comprises a plurality of resistive elements, wherein a first number of the resistive elements that have a first resistance and are ones, in the plurality of columns, closest to the plurality of sense amplifiers is different from a second number of the resistive elements that have a second resistance and are ones, in the plurality of columns, closest to the plurality of sense amplifiers, the first and second resistances being different from each other; and
a connection line coupled to the plurality of data lines, wherein in a read mode, one of the plurality of sense amplifiers is configured to access the plurality of resistive elements arranged in one of the plurality of columns.

2. The memory device of claim 1, wherein in the read mode, the one of the plurality of sense amplifiers is configured to access the plurality of resistive elements arranged in all of the plurality of columns.

3. The memory device of claim 1, wherein the first resistance corresponds to a first logic value of the plurality of memory cells, and
the second resistance corresponds to a second logic value of the plurality of memory cells.

4. The memory device of claim 1, wherein first reference cell and the first sense amplifier are arranged in a first column of the plurality of columns.

5. The memory device of claim 4, wherein a second sense amplifier in the plurality of sense amplifiers is coupled to a pinned layer of a third resistive element in the plurality of resistive elements and a read current from the second sense amplifier to a ground terminal flows through the pinned layer of the third resistive element, a free layer of the third resistive element, a free layer of a fourth resistive element in the plurality of resistive elements and a pinned layer of the fourth resistive element sequentially.

6. The memory device of claim 5, wherein the second sense amplifier and the third to fourth resistive elements are arranged in a same column of the plurality of columns.

7. The memory device of claim 1, wherein one of the plurality of sense amplifiers is coupled to a free layer of one of the plurality of resistive elements, the one of the plurality of resistive elements having the low resistance.

8. The memory device of claim 1, wherein one of the plurality of sense amplifiers is coupled to a pinned layer of one of the plurality of resistive elements, the one of the plurality of resistive elements having the high resistance.

9. A memory device, comprising:
a first sense amplifier arranged in a first column;
a first reference cell comprising a first string of resistive elements of low and high resistances that are in the first column and are coupled between a ground and a first input of the first sense amplifier;
a second sense amplifier arranged in a second column and_coupled to the first sense amplifier in parallel; and
a second reference cell comprising a second string of resistive elements of the low and high resistances that are in the second column and are coupled between the ground and a first input of the second sense amplifier, wherein a first number of resistive elements in the first string of resistive elements is different from a second number of resistive elements in the second string of resistive elements.

10. The memory device of claim 9, further comprising:
a third sense amplifier coupled to the second sense amplifier in parallel; and
a third reference cell arranged in a third column, coupled to the third sense amplifier, and comprising the first number of the plurality of resistive elements, wherein the plurality of resistive elements in the third reference cell comprise a plurality of fifth resistive elements having the high resistance.

11. The memory device of claim 10, further comprising:
a fourth sense amplifier coupled to the third sense amplifier in parallel; and
a fourth reference cell arranged in a fourth column, coupled to the fourth sense amplifier, and comprising the first number of the plurality of resistive elements, wherein the plurality of resistive elements in the fourth reference cell comprise a plurality of sixth resistive elements having the low resistance.

12. The memory device of claim 11, wherein in a read mode, one of the first sense amplifier, the second sense amplifier, the third sense amplifier, and the fourth sense amplifier is configured to access all of the plurality of resistive elements in the first reference cell, the second reference cell, the third reference cell, and the fourth reference cell.

13. The memory device of claim 9, wherein the first sense amplifier is coupled to a free layer of one resistive element in the first string of resistive elements, the one of the first string of resistive elements having the low resistance.

14. The memory device of claim 9, further comprising:
a plurality of resistive elements arranged in rows and columns including the first and second strings of the resistive elements in the first and second columns,
wherein a total resistance value of the resistive elements in a first row of the rows is different from a total resistance value of the resistive elements in a second row, different from the first row, of the rows.

15. A memory device, comprising:
a plurality of first sense amplifiers arranged in a plurality of first columns respectively;
a plurality of first reference cells arranged in the plurality of first columns respectively, wherein each of the first reference cells comprises a first resistive element and a second resistive element,
wherein a corresponding one of the plurality of first sense amplifiers is coupled to a pinned layer of the first resistive element, wherein a free layer of the first resistive element is coupled to a free layer of the second resistive element, and a pinned layer of the second resistive element is coupled to a source line;
at least one second sense amplifier arranged in at least one second column; and
at least one second reference cell arranged in the at least one second column, wherein the at least one second reference cell comprises a third resistive element and a fourth resistive element,
wherein the at least one second sense amplifier is coupled to a free layer of the third resistive element, and a pinned layer of the third resistive element is coupled to a free layer of the fourth resistive element,
wherein in a read mode, the second sense amplifier is configured to access a plurality of resistive elements in each of the plurality of first reference cells,
wherein a first one of the plurality of first reference cells comprises a first string of resistive elements of low and high resistances that are in a first one of the plurality of first columns and are coupled between a ground and a first input of a first one of the plurality of first sense amplifiers, and
a second one of the plurality of first reference cells comprises a second string of resistive elements of the low and high resistances that are in a second one of the plurality of first columns and are coupled between the ground and a first input of a second one of the plurality of first sense amplifiers,
wherein a first number of resistive elements in the first string of the resistive elements is different from a second number of resistive elements in the second string of the resistive elements.

16. The memory device of claim 15, wherein in the read mode, the at least one second sense amplifier is further configured to access the at least one second reference cell.

17. The memory device of claim 15, further comprising:
a plurality of first reference data lines coupled between the plurality of first sense amplifiers and the plurality of first reference cells respectively,
wherein the pinned layer of the first resistive element is directly coupled to a corresponding first reference data line of the first reference data lines.

18. The memory device of claim 17, further comprising:
at least one second reference data line coupled between the at least one second sense amplifier and the at least one second reference cell,
wherein the free layer of the third resistive element is directly coupled to the at least one second reference data line.

19. The memory device of claim 15, wherein the first resistive element has the high resistance and the second resistive element has the low resistance.

20. The memory device of claim 19, wherein the third resistive element has the low resistance.

* * * * *